United States Patent
Kim et al.

(10) Patent No.: US 11,848,715 B2
(45) Date of Patent: Dec. 19, 2023

(54) DEVICE FOR TESTING ANTENNA MODULE COMPRISING PLURALITY OF ANTENNA ELEMENTS

(71) Applicant: Samsung Electronics Co., Ltd., Suwon-si (KR)

(72) Inventors: Byungchul Kim, Suwon-si (KR); Sanghoon Park, Suwon-si (KR); Seungtae Ko, Suwon-si (KR); Seungku Han, Suwon-si (KR); Youngju Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 386 days.

(21) Appl. No.: 17/415,385

(22) PCT Filed: Dec. 26, 2019

(86) PCT No.: PCT/KR2019/018442
§ 371 (c)(1),
(2) Date: Jun. 17, 2021

(87) PCT Pub. No.: WO2020/138939
PCT Pub. Date: Jul. 2, 2020

(65) Prior Publication Data
US 2022/0069924 A1    Mar. 3, 2022

(30) Foreign Application Priority Data

Dec. 26, 2018   (KR) .................. 10-2018-0169843

(51) Int. Cl.
*H04B 17/00* (2015.01)
*H04B 17/29* (2015.01)
(Continued)

(52) U.S. Cl.
CPC .......... *H04B 17/29* (2015.01); *G01R 29/105* (2013.01); *H01Q 21/00* (2013.01)

(58) Field of Classification Search
CPC ...... H04B 17/15; H04B 17/19; H04B 17/191; H04B 17/202; H04B 17/16; H01Q 21/00; H01Q 1/12
See application file for complete search history.

(56) References Cited

U.S. PATENT DOCUMENTS 8,527,229 B2 * 9/2013 Chang .................... G01C 19/00
702/104
10,177,862 B2 * 1/2019 Wen ...................... H04B 17/391
(Continued)

FOREIGN PATENT DOCUMENTS

JP          2010-124360 A     6/2010
KR    10-2017-0069235 A     6/2017

*Primary Examiner* — Tuan Pham
(74) *Attorney, Agent, or Firm* — Jefferson IP Law, LLP

(57) ABSTRACT

The present invention relates to a communication technique for converging IoT technology with a 5G communication system for supporting a higher data transmission rate beyond a 4G system, and a system therefor. The present disclosure may be applied to an intelligent service (for example, a smart home, a smart building, a smart city, a smart car or connected car, health care, digital education, retail business, a security and safety-related service, etc.) on the basis of 5G communication technology and IoT-related technology. The present invention provides a device for testing an antenna module, the device comprising: a seating unit which has seated thereon a first antenna module comprising a plurality of antenna elements; a second antenna module which comprises a plurality of antenna elements and is disposed so as to face the seating unit so as to be capable of emitting a radio wave toward the first antenna module; and a control unit which is electrically connected to the second antenna module and tests the performance of the first antenna module by (Continued)

controlling the second antenna module by grouping each antenna element of the second antenna module into at least one antenna element group.

20 Claims, 8 Drawing Sheets

(51) Int. Cl.
*G01R 29/10* (2006.01)
*H01Q 21/00* (2006.01)

(56) References Cited

U.S. PATENT DOCUMENTS

| | | |
|---|---|---|
| 2008/0129615 A1* | 6/2008 | Breit .................... H04W 56/00 343/703 |
| 2011/0270567 A1 | 11/2011 | Mow et al. |
| 2017/0242061 A1 | 8/2017 | Gottl et al. |
| 2017/0359739 A1 | 12/2017 | Reed |
| 2018/0048399 A1 | 2/2018 | Thiruvarankan |
| 2018/0076907 A1 | 3/2018 | Naseef et al. |

* cited by examiner

DEVICE FOR TESTING ANTENNA MODULE COMPRISING PLURALITY OF ANTENNA ELEMENTS

TECHNICAL FIELD

The disclosure provides a test device for efficiently testing the performance of an antenna module including a plurality of antenna elements.

BACKGROUND ART

To meet the ever increasing demand for wireless data traffic since the commercialization of $4^{th}$ generation (4G) communication systems, efforts have been made to develop improved $5^{th}$ generation (5G) or pre-5G communication systems. As such, 5G or pre-5G communication systems are also called "beyond 4G network system" or "post Long Term Evolution (LTE) system". To achieve high data rates, 5G communication systems are being considered for implementation in the extremely high frequency (mmWave) band (e.g., 60 GHz band). To decrease path loss of radio waves and increase the transmission distance in the mmWave band, various technologies including beamforming, massive multiple-input multiple-output (massive MIMO), full dimensional MIMO (FD-MIMO), array antennas, analog beamforming, and large scale antennas are considered for 5G communication systems. In addition, to improve system networks in 5G communication systems, technology development is under way regarding evolved small cells, advanced small cells, cloud radio access networks (cloud RANs), ultra-dense networks, device-to-device (D2D) communication, wireless backhaul, moving networks, cooperative communication, coordinated multi-points (CoMP), interference cancellation, and the like. Additionally, advanced coding and modulation (ACM) schemes such as hybrid frequency shift keying and quadrature amplitude modulation (FQAM) and sliding window superposition coding (SWSC), and advanced access technologies such as filter bank multi carrier (FBMC), non-orthogonal multiple access (NOMA), and sparse code multiple access (SCMA) are also under development for 5G systems.

Meanwhile, the Internet is evolving from a human centered network where humans create and consume information into the Internet of Things (IoT) where distributed elements such as things exchange and process information. There has also emerged the Internet of Everything (IoE) technology that combines IoT technology with big data processing technology through connection with cloud servers. To realize IoT, technology elements related to sensing, wired/wireless communication and network infrastructure, service interfacing, and security are needed, and technologies interconnecting things such as sensor networks, machine-to-machine (M2M) or machine type communication (MTC) are under research in recent years. In IoT environments, it is possible to provide intelligent Internet technology services, which collect and analyze data created by interconnected things to add new values to human life. Through convergence and combination between existing information technologies and various industries, IoT technology may be applied to various areas such as smart homes, smart buildings, smart cities, smart or connected cars, smart grids, health-care, smart consumer electronics, and advanced medical services.

Accordingly, various attempts are being made to apply 5G communication systems to IoT networks. For example, sensor networks and machine-to-machine (M2M) or machine type communication (MTC) are being realized by use of 5G communication technologies including beamforming, MIMO, and array antennas. Application of cloud RANs as a big data processing technique described above may be an instance of convergence of 5G technology and IoT technology.

DISCLOSURE OF INVENTION

Technical Problem

The disclosure provides a test device for efficiently testing the performance of an antenna module including a plurality of antenna elements used in a 5G mobile communication system.

Solution to Problem

The disclosure provides an antenna module test device that includes: a seating portion on which a first antenna module including a plurality of antenna elements is seated; a second antenna module that includes a plurality of antenna elements and is disposed to face the seating portion so as to radiate radio waves toward the first antenna module; and a controller that is electrically connected to the second antenna module and tests the performance of the first antenna module by controlling the second antenna module through grouping the antenna elements of the second antenna module into one or more antenna element groups.

The disclosure provides a test method for an antenna module that includes: disposing a first antenna module and disposing a second antenna module to face the first antenna module so as to radiate radio waves toward the first antenna module; grouping antenna elements of the second antenna module into at least one element group; and testing the performance of the first antenna module by controlling each antenna element group of the second antenna module.

Advantageous Effects of Invention

According to an embodiment disclosed in the disclosure, it is possible to reduce the size of a test device for testing the performance of an antenna module. In addition, according to an embodiment disclosed in the disclosure, it is possible to reduce the time required for testing the performance of an antenna module.

MODE FOR THE INVENTION

Figure 1:
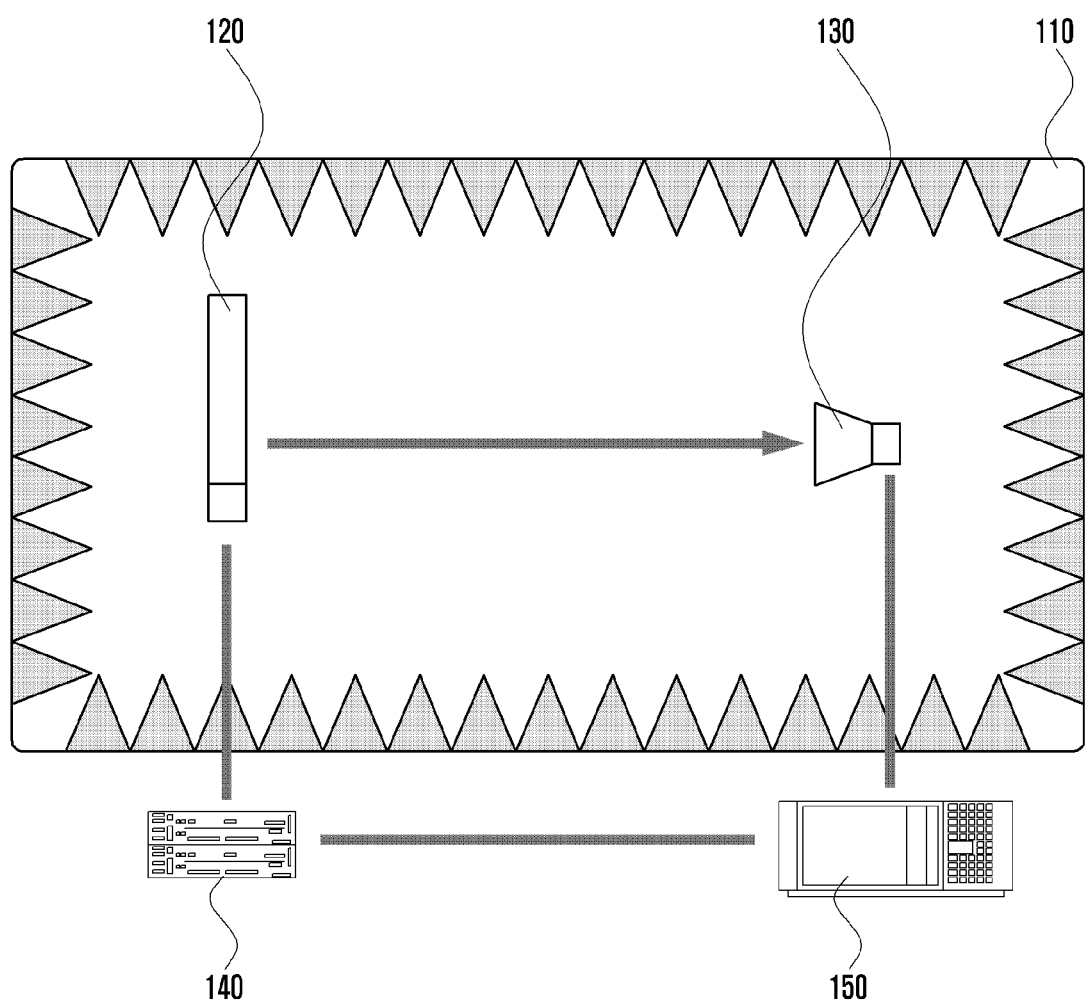
FIG. 1 is a diagram showing a chamber for testing the performance of an antenna module.

In the description of embodiments of the disclosure, descriptions of technical details well known in the art and not directly related to the disclosure may be omitted. This is to more clearly convey the gist of the disclosure without obscurities by omitting unnecessary descriptions.

Likewise, in the drawings, some elements are exaggerated, omitted, or only outlined in brief. Also, the size of each element does not necessarily reflect the actual size. The same reference symbols are used throughout the drawings to refer to the same or corresponding parts.

Advantages and features of the disclosure and methods for achieving them will be apparent from the following detailed description of embodiments taken in conjunction with the accompanying drawings. However, the disclosure is not limited to the embodiments disclosed below but may be implemented in various different ways, the embodiments are provided only to complete the disclosure and to fully inform the scope of the disclosure to those skilled in the art to which the disclosure pertains, and the disclosure is defined only by the scope of the claims. The same reference symbols are used throughout the specification to refer to the same parts.

Meanwhile, it will be appreciated that blocks of a flowchart and a combination of flowcharts may be executed by computer program instructions. These computer program instructions may be loaded on a processor of a general purpose computer, special purpose computer, or programmable data processing equipment, and the instructions executed by the processor of a computer or programmable data processing equipment create a means for carrying out functions described in blocks of the flowchart. To implement the functionality in a certain way, the computer program instructions may also be stored in a computer usable or readable memory that is applicable in a specialized computer or a programmable data processing equipment, and it is possible for the computer program instructions stored in a computer usable or readable memory to produce articles of manufacture that contain a means for carrying out functions described in blocks of the flowchart. As the computer program instructions may be loaded on a computer or a programmable data processing equipment, when the computer program instructions are executed as processes having a series of operations on a computer or a programmable data processing equipment, they may provide steps for executing functions described in blocks of the flowchart.

Additionally, each block of a flowchart may correspond to a module, a segment or a code containing one or more executable instructions for executing one or more logical functions, or to a part thereof. It should also be noted that functions described by blocks may be executed in an order different from the listed order in some alternative cases. For example, two blocks listed in sequence may be executed substantially at the same time or executed in reverse order according to the corresponding functionality.

Here, the word "unit", "module", or the like used in the embodiments may refer to a software component or a hardware component such as an FPGA or ASIC capable of carrying out a function or an operation. However, "unit" or the like is not limited to hardware or software. A unit or the like may be configured so as to reside in an addressable storage medium or to drive one or more processors. For example, units or the like may refer to components such as a software component, object-oriented software component, class component or task component, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose larger components and units. Further, components and units may be implemented to drive one or more processors in a device or a secure multimedia card. In addition, a unit or the like may include one or more processors in an embodiment.

FIG. 1 is a diagram showing a chamber for testing the performance of an antenna module.

According to an embodiment, the chamber 110 for testing the performance of an antenna module may include a first antenna module 120 to be performance tested, a second antenna module 130 to radiate or receive a test radio wave to or from the antenna module to be performance tested, a first controller 140 to measure or check power transmitted or received by the first antenna module 120, and a second controller 150 electrically connected to the first controller and for measuring or checking power transmitted or received by the second antenna module 130.

According to an embodiment, an over-the-air (OTA) test of the first antenna module 120 may be conducted through the chamber 110. According to various embodiments, in a 5G mobile communication system, the first antenna module 120 may include four or more antenna elements. For example, the first antenna module 120 may include 64 antenna elements.

According to an embodiment, the time required for the OTA test of the first antenna module 120 may increase in proportion to the number of antenna elements included in the first antenna module 120. For example, the time required for the OTA test when the number of antenna elements is 64 may be 16 times longer than the time required for the OTA test when the number of antenna elements is 4.

According to various embodiments, an OTA test may be simultaneously conducted on a plurality of propagation paths formed through one antenna element. However, when an OTA test is conducted on a plurality of propagation paths at the same time, the discrimination power for the performance of the antenna module for each propagation path may be reduced. In addition, when an OTA test is conducted on a plurality of propagation paths at the same time, the required distance between the first antenna module 120 and the second antenna module 130 may increase, so that the size of the chamber 110 may increase.

Figure 2:
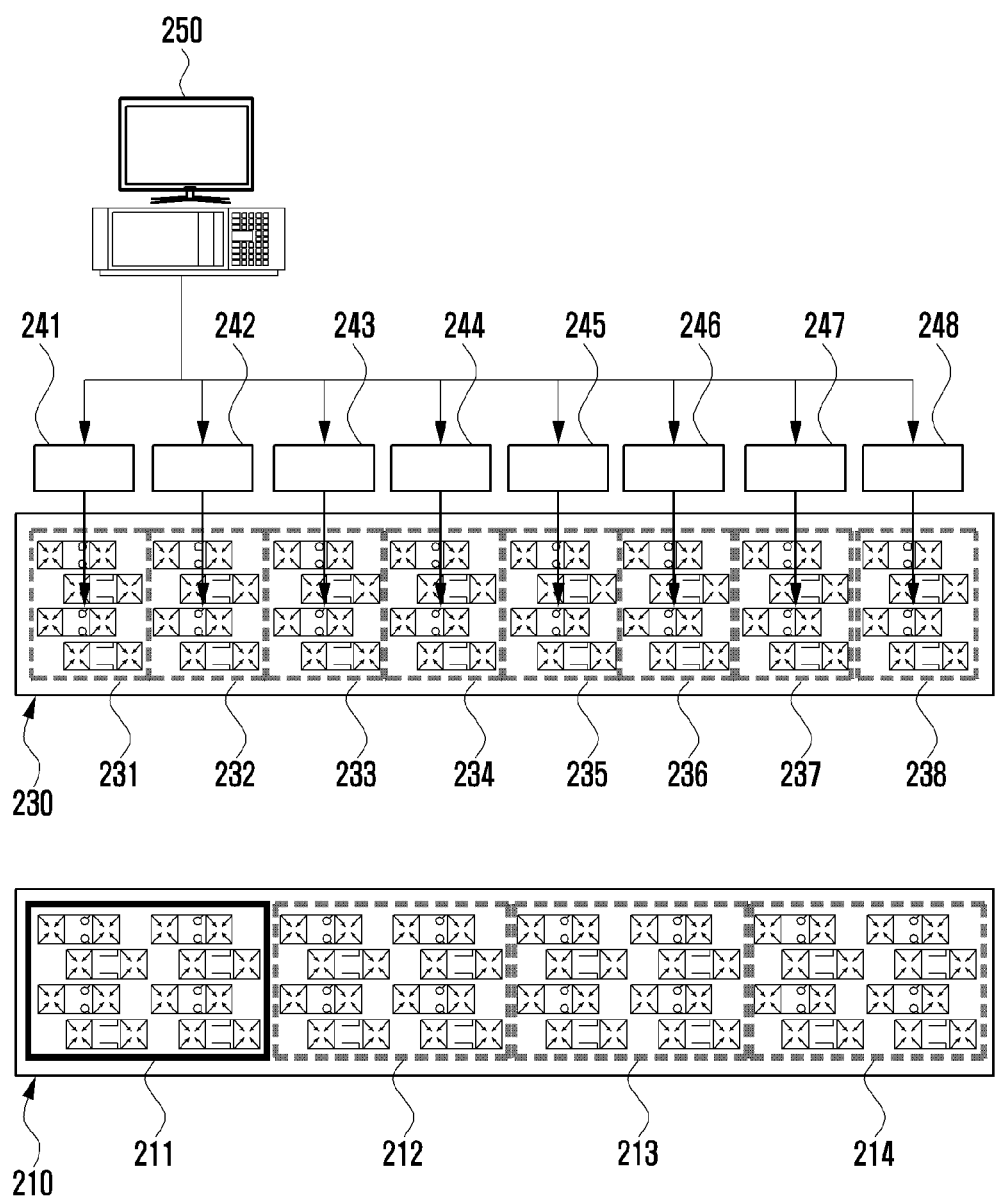
FIG. 2 is a diagram illustrating a device for testing transmission performance of an antenna module according to an embodiment disclosed in the disclosure.

FIG. 2 is a diagram illustrating a device for testing transmission performance of an antenna module according to an embodiment disclosed in the disclosure.

According to an embodiment, the antenna module test device may include a seating portion on which the first antenna module 210 including a plurality of antenna elements is seated, a second antenna module 230 including a plurality of antenna elements and disposed to face the seating portion so as to radiate radio waves toward the first antenna module 210, and a controller 250 that is electrically connected to the second antenna module 230 and tests the performance of the first antenna module 210 by controlling the second antenna module 230 through grouping the antenna elements of the second antenna module 230 into one or more antenna element groups 231, 232, 233, 234, 235, 236, 237 and 238.

According to an embodiment, the first antenna module 210 and the second antenna module 230 may include the same number of antenna elements. For example, the first antenna module 210 and the second antenna module 230 may be of the same antenna module. According to various embodiments, the antenna elements of the second antenna module 230 may be disposed to face the antenna elements of the first antenna module 210, respectively. For example, the antenna elements of the first antenna module 210 and the antenna elements of the second antenna module 230 may be aligned to face each other.

According to an embodiment, the distance between the first antenna module 210 and the second antenna module 230 may be determined based on the frequency of a radio wave radiated through the first antenna module 210. For example, as the frequency of the radio wave radiated through the first antenna module 210 increases, the distance between the first antenna module 210 and the second antenna module 230 may increase.

According to various embodiments, the distance between the first antenna module 210 and the second antenna module 230 may be determined based on the size of the first antenna module 210. For example, the distance between the first antenna module 210 and the second antenna module 230 may be determined based on the diagonal length of the first antenna module 210.

According to an embodiment, the antenna module test device may include a plurality of power dividers 241, 242, 243, 244, 245, 246, 247 and 248 disposed in correspondence with the antenna element groups 231, 232, 233, 234, 235, 236, 237 and 238 of the second antenna module 230.

For example, the second antenna module 230 may include 64 antenna elements, and eight antenna elements may be included in one antenna element group. That is, the second antenna module 230 may include eight antenna element groups 231, 232, 233, 234, 235, 236, 237 and 238. According to various embodiments, the first power divider 241 may be disposed in correspondence with the first antenna element group 231, and the second power divider 242 may be disposed in correspondence with the second antenna element group 232. On the same principle, the third to the eighth dividers 243 to 248 may be disposed in correspondence with the third to the eighth antenna element groups 233 to 238, respectively.

According to an embodiment, one antenna element group may include at least one sub antenna array, and one sub antenna array may include two antenna elements. For example, one antenna element group may include four sub antenna arrays, and each sub antenna array may include two antenna elements. According to various embodiments, the antenna elements constituting one sub antenna array may emit a vertically polarized wave and a horizontally polarized wave, respectively.

According to an embodiment, the distance between the first antenna module 210 and the second antenna module 230 may be determined based on the number of antenna element groups constituting the second antenna module 230. For example, as the number of antenna element groups constituting the second antenna module 230 increases, the distance between the first antenna module 210 and the second antenna module 230 may decrease.

According to an embodiment, the controller 250 may test the transmission performance of the first antenna module by allowing the antenna element groups 231, 232, 233, 234, 235, 236, 237 and 238 of the second antenna module 230 to receive the transmission power transmitted from each antenna element of the first antenna module 210.

According to an embodiment, the antenna element groups 231, 232, 233, 234, 235, 236, 237 and 238 of the second antenna module 230 may sequentially receive power transmitted from the first antenna element of the first antenna module 210. For example, the power transmitted from the first antenna element may be received firstly by the first antenna element group 231, received secondly by the second antenna element group 232, received thirdly by the third antenna element group 233, received fourthly by the fourth antenna element group 234, received fifthly by the fifth antenna element group 235, received sixthly by the sixth antenna element group 236, received seventhly by the seventh antenna element group 237, and received eighthly by the eighth antenna element group 238.

According to an embodiment, the controller 250 may test the transmission performance of the first antenna element of the first antenna module by receiving the reception power received sequentially by the antenna element groups through the power dividers 241, 242, 243, 244, 245, 246, 247 and 248 that are disposed corresponding respectively to the antenna element groups. For example, the controller 250 may check the output power, the error vector magnitude, the frequency tolerance, and the adjacent channel leakage power ratio of the first antenna module through the above scheme.

According to an embodiment, the first antenna module 210 may also be grouped into antenna element groups including at least one antenna element. For example, the first antenna module 210 may include 64 antenna elements, and may be grouped into four antenna element groups 211, 212, 213 and 214.

The antenna module test device shown in FIG. 2 is only one embodiment according to embodiments of the disclosure. Therefore, the scope of the disclosure should not be limited to the antenna module test device shown in FIG. 2. For example, the number of antenna elements constituting the antenna module and the number of antenna element groups may be changed.

Figure 3:
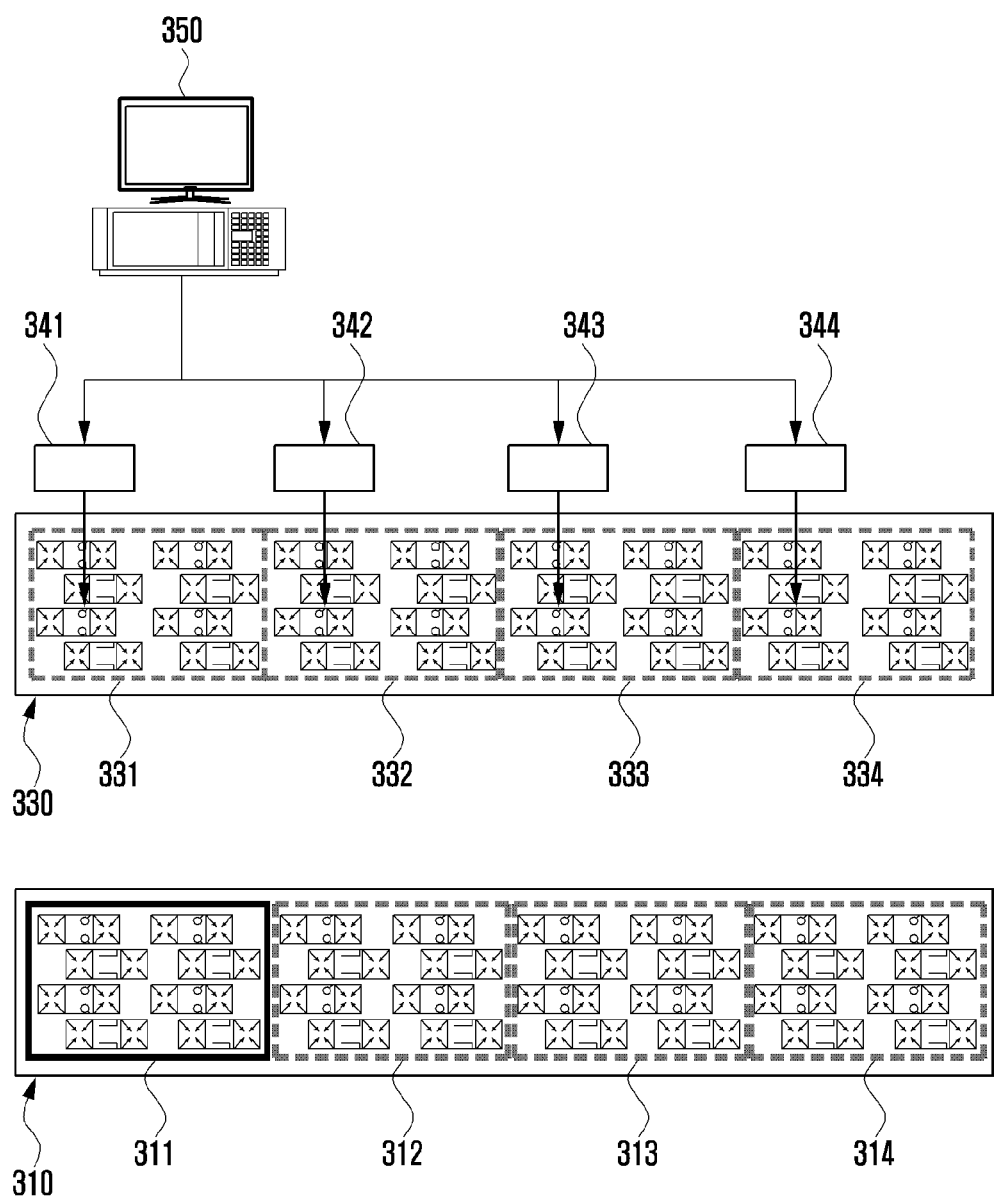
FIG. 3 is a diagram illustrating a device for testing reception performance of an antenna module according to an embodiment disclosed in the disclosure.

FIG. 3 is a diagram illustrating a device for testing reception performance of an antenna module according to an embodiment disclosed in the disclosure.

According to an embodiment, the antenna module test device may include a seating portion on which the first antenna module 310 including a plurality of antenna elements is seated, a second antenna module 330 including a plurality of antenna elements and disposed to face the seating portion so as to radiate radio waves toward the first antenna module 310, and a controller 230 that is electrically connected to the second antenna module 330 and tests the performance of the first antenna module 310 by controlling the second antenna module 330 through grouping the antenna elements of the second antenna module 330 into one or more antenna element groups 331, 332, 333 and 334.

According to an embodiment, the antenna module test device may include a plurality of power combiners 341, 342, 343 and 344 disposed in correspondence with the antenna element groups 331, 332, 333 and 334 of the second antenna module 330.

For example, the second antenna module 330 may include 64 antenna elements, and one antenna element group may include 16 antenna elements. That is, the second antenna module 330 may include four antenna element groups 331, 332, 333 and 334. According to various embodiments, the first power combiner 341 may be disposed corresponding to the first antenna element group 331, the second power combiner 342 may be disposed corresponding to the second antenna element group 332, the third power combiner 343 may be disposed corresponding to the third antenna element group 333, and the fourth power combiner 344 may be disposed corresponding to the fourth antenna element group 334.

According to an embodiment, the controller 350 may test the reception performance of the first antenna module 310 by turning on the antenna element groups 331, 332, 333 and 334 of the second antenna module 330 in sequence and obtaining the reception power of the first antenna module 310 whenever one antenna element group is turned on.

According to an embodiment, the controller 350 may determine the reception power of the first antenna module 310 by obtaining reception power received by each antenna element of the first antenna module 310. For example, the controller 350 may determine the reception power of the first antenna element of the first antenna module on the basis of first reception power at the first antenna element of the first antenna module when the first antenna element group 331 is turned on, second reception power at the first antenna module of the first antenna element when the second antenna element group 332 is turned on, third reception power at the first antenna element of the first antenna module when the third antenna element group 333 is turned on, and fourth reception power at the first antenna element of the first antenna module when the fourth antenna element group 334 is turned on.

According to an embodiment, the reception power at each antenna element of the first antenna module 310 may be measured through a separately provided measuring instrument and then transmitted to the controller 350. According to various embodiments, the controller 350 may directly obtain reception power received at each antenna element of the first antenna module 310.

According to an embodiment, the controller 350 may test the reception performance of the first antenna module based on the reception power of the first antenna module 310. For example, the controller 350 may check the received signal strength indicator (RSSI) and reference sensitivity performance of the first antenna module based on the reception power of the first antenna module 310.

According to an embodiment, the first antenna module 310 may also be grouped into antenna element groups including at least one antenna element. For example, the first antenna module 310 may include 64 antenna elements, and may be grouped into four antenna element groups 311, 312, 313 and 314.

The antenna module test device shown in FIG. 3 is only one embodiment according to embodiments of the disclosure. Therefore, the scope of the disclosure should not be limited to the antenna module test device shown in FIG. 3. For example, the number of antenna elements constituting the antenna module and the number of antenna element groups may be changed.

Figure 4A:
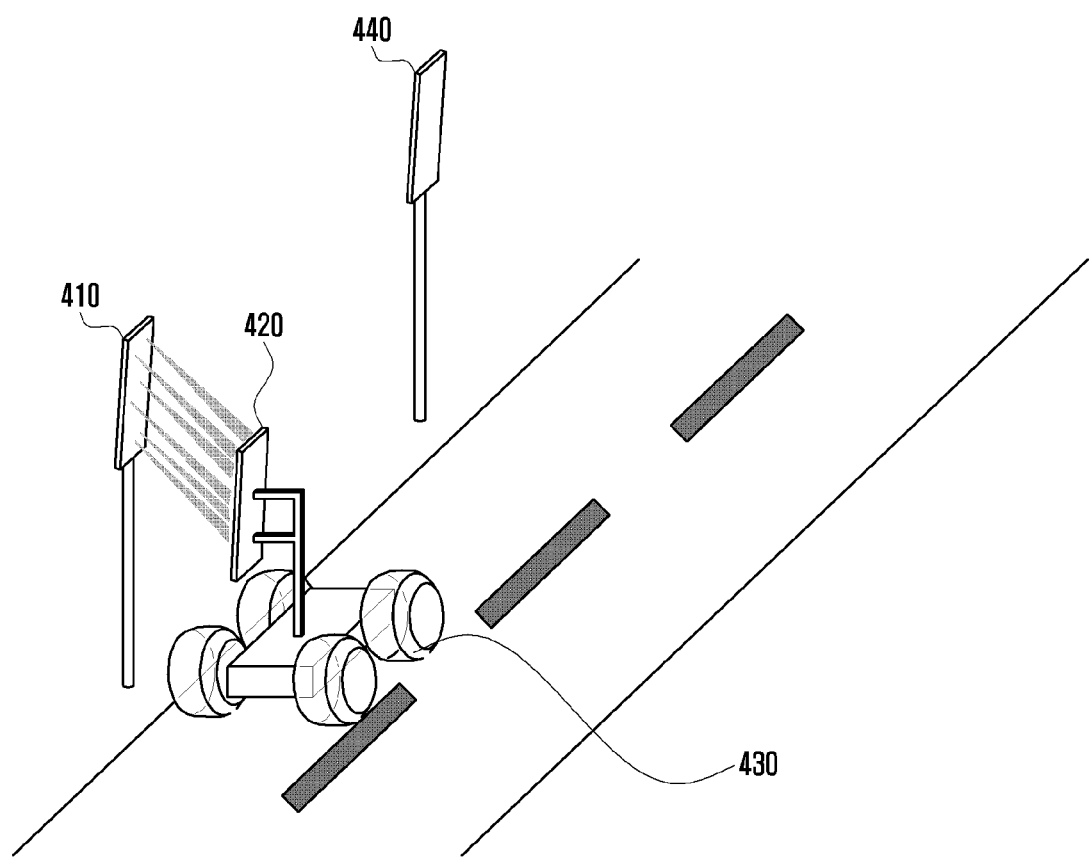
FIGS. 4A and 4B are diagrams illustrating various embodiments of an antenna module test device.
Figure 4B:
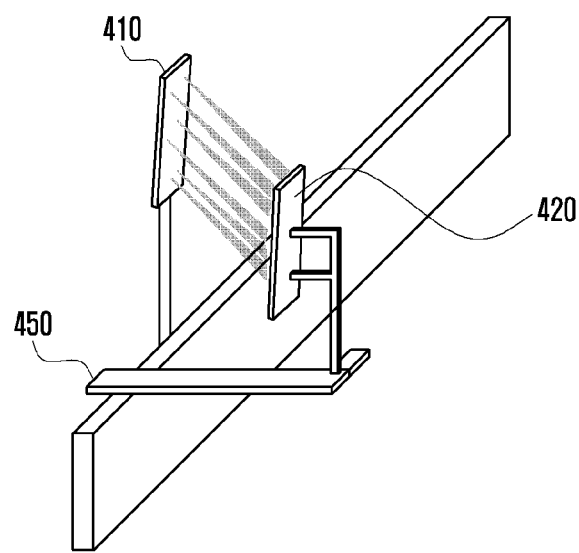

FIGS. 4A and 4B are diagrams illustrating various embodiments of an antenna module test device.

According to an embodiment, a first antenna module 410 and a second antenna module 440 may be disposed to be spaced apart by a specific distance along a road. According to various embodiments, the first antenna module 410 and the second antenna module 440 may be tested for performance while a transportation device 430 including a test antenna module 420 moves along the road.

According to an embodiment, it is possible to reduce the distance between the first antenna module 410 and the test antenna module 420 required during the performance test by testing the performance of the first antenna module 410 through grouping plural antenna elements constituting the test antenna module 420 into antenna element groups including at least one antenna element.

According to various embodiments, it is possible to reduce the time required for conducting the performance test by testing the performance of the first antenna module 410 through grouping plural antenna elements constituting the test antenna module 420 into antenna element groups including at least one antenna element. For example, as the number of antenna elements included in one antenna element group increases, the time required for the performance test of the first antenna module 410 may decrease.

According to an embodiment, as the performance of the antenna module included in a base station can be continuously through the transportation device 430 including the test antenna module 420 even after the base station is installed, this may be desirable for the maintenance of the base station. Furthermore, the utility value of the disclosure may be further increased in a 5G mobile communication system requiring a plurality of base stations.

According to an embodiment, the test antenna module 420 may be disposed to be spaced apart by a specific distance from the antenna module 410 through a fixing member 450. For example, the fixing member 450 may include a jig. According to various embodiments, the separation distance between the antenna module 410 and the test antenna module 420 spaced apart by the fixing member 450 may be determined based on the frequency of a radio wave radiated through the antenna module 410.

Figure 5:
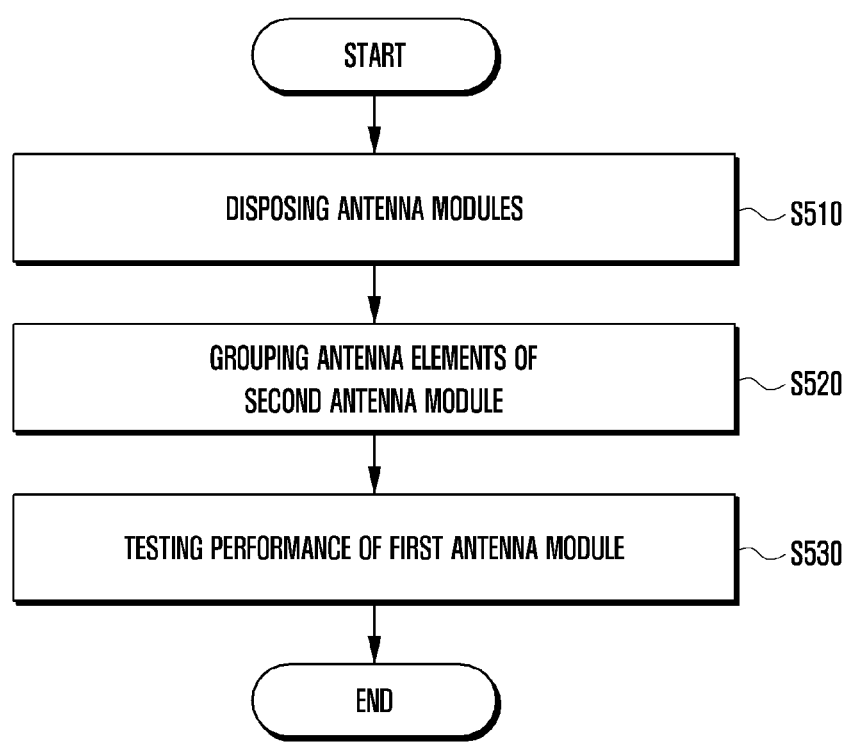
FIG. 5 is a flowchart of an antenna module test method according to an embodiment disclosed in the disclosure.

FIG. 5 is a flowchart of an antenna module test method according to an embodiment disclosed in the disclosure. According to an embodiment, operations shown in FIG. 5 may be performed by the controller 250 shown in FIG. 2 or the controller 350 shown in FIG. 3.

According to an embodiment, at step S510, it is possible to dispose the first antenna module and dispose the second antenna module to face the first antenna module so as to radiate radio waves toward the first antenna module.

According to an embodiment, the first antenna module and the second antenna module may include a plurality of antenna elements. According to various embodiments, the number of antenna elements constituting the first antenna module and the number of antenna elements constituting the second antenna module may be the same, and the second antenna module may be disposed so that the antenna elements constituting the first antenna module and the antenna elements constituting the second antenna module are aligned facing each other.

According to an embodiment, the distance between the first antenna module and the second antenna module may be determined based on the frequency of a radio wave radiated through the first antenna module or the second antenna module.

According to an embodiment, at step S520, the antenna elements of the second antenna module may be grouped into at least one element group. For example, when the second antenna module includes 64 antenna elements, the second antenna module may be grouped into 8 antenna element groups. (In this case, the number of antenna elements included in one antenna element group may be eight.)

According to an embodiment, at step S530, the performance of the first antenna module may be tested by controlling each antenna element group of the second antenna module. For example, the controller 250 or 350 may test the transmission performance or reception performance of the first antenna module by controlling each antenna element group of the second antenna module.

According to an embodiment, the time required for the performance test of the first antenna module may be determined based on the number of antenna elements constituting the antenna element groups of the second antenna module. For example, as the number of antenna elements constituting one antenna element group increases, the time required for the performance test of the antenna module may decrease.

Figure 6:
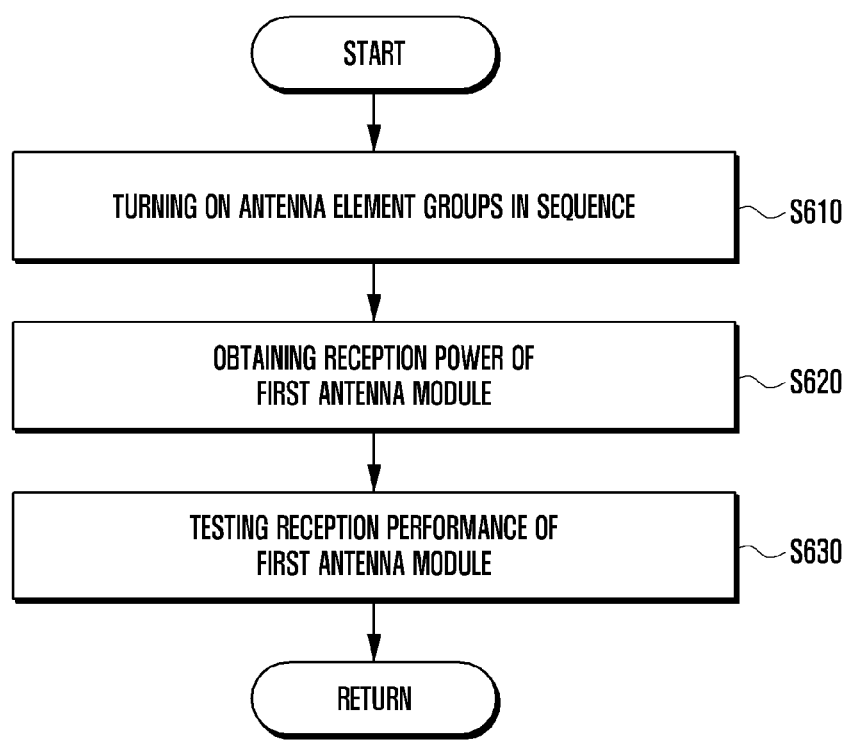
FIG. 6 is a flowchart of a reception performance test method for an antenna module according to an embodiment disclosed in the disclosure.

FIG. 6 is a flowchart of a reception performance test method for an antenna module according to an embodiment disclosed in the disclosure. According to an embodiment, operations shown in FIG. 6 may be performed by the controller 350 shown in FIG. 3.

According to an embodiment, at step S610, the controller 350 may sequentially turn on the antenna element groups of the second antenna module. For example, if the second antenna module includes four antenna element groups, the controller 350 may firstly turn on the first antenna element group, secondly turn on the second antenna element group, thirdly turn on the third antenna element group, and fourthly turn on the fourth antenna element group. According to various embodiments, each antenna element group of the second antenna module may include at least one antenna element.

According to an embodiment, at step S620, the controller 350 may obtain the reception power of the first antenna module whenever one antenna element group of the second antenna module is turned on. For example, the controller 350 may obtain the reception power at the first antenna element of the first antenna module when only the first antenna element group of the second antenna module is turned on, obtain the reception power at the first antenna element of the first antenna module when only the second antenna element group of the second antenna module is turned on, obtain the reception power at the first antenna element of the first antenna module when only the third antenna element group of the second antenna module is turned on, and obtain the reception power at the first antenna element of the first antenna module when only the fourth antenna element group of the second antenna module is turned on.

According to various embodiments, the controller 350 may obtain the reception power at each antenna element of the first antenna module through a power measuring instrument electrically connected to the first antenna module. Alternatively, the controller 350 may directly measure the reception power at each antenna element of the first antenna module.

According to an embodiment, at step S630, the controller 350 may test the reception performance of the first antenna module based on the obtained reception power of the first antenna module. For example, the controller 350 may check the received signal strength indicator (RSSI) and reference sensitivity performance of the first antenna module based on the reception power of the first antenna module.

Figure 7:
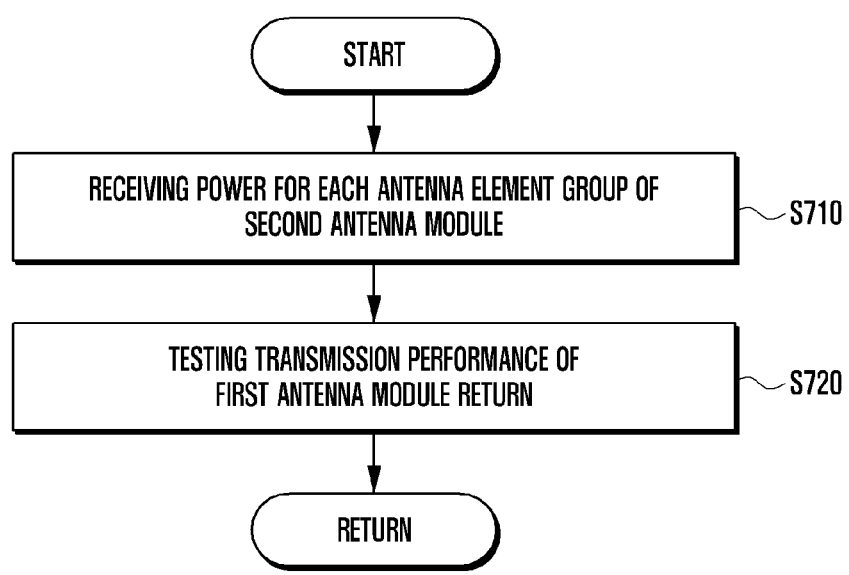
FIG. 7 is a flowchart of a transmission performance test method for an antenna module according to an embodiment disclosed in the disclosure.

FIG. 7 is a flowchart of a transmission performance test method for an antenna module according to an embodiment disclosed in the disclosure. According to an embodiment, operations shown in FIG. 8 may be performed by the controller 250 shown in FIG. 2.

According to an embodiment, at step S710, the controller 250 may receive transmission power transmitted by each antenna element of the first antenna module for each antenna element group of the second antenna module. For example, if there are two antenna element groups of the second antenna module, the controller 250 may receive first power through the first antenna element group of the second antenna module and receive second power through the second antenna element group of the second antenna module.

According to an embodiment, at step S720, the controller 250 may test the transmission performance of the first antenna module based on the reception power received for each antenna element group. According to various embodiments, the controller 250 may determine the reception power received from the first antenna element of the first antenna module based on the first power received through the first antenna element group of the second antenna module and the second power received through the second antenna element group of the second antenna module, and the controller 250 may test the transmission performance of the first antenna module based on the determined reception power and the transmission power of the first antenna element of the first antenna module.

According to an embodiment, the controller 250 may determine the reception power received for each antenna element group through power dividers disposed corresponding to the antenna element groups of the second antenna module, and may test the transmission performance of the first antenna module based on the reception power. For example, the controller 250 may check the output power, the error vector magnitude, the frequency tolerance, and the adjacent channel leakage power ratio of the first antenna module through the above scheme.

According to an embodiment, an antenna module test device may include: a seating portion on which a first antenna module including a plurality of antenna elements is seated; a second antenna module that includes a plurality of antenna elements and is disposed to face the seating portion so as to radiate radio waves toward the first antenna module; and a controller that is electrically connected to the second antenna module and tests the performance of the first antenna module by controlling the second antenna module through grouping the antenna elements of the second antenna module into one or more antenna element groups.

According to an embodiment, the number of antenna elements of the first antenna module and the number of antenna elements of the second antenna module may be the same, and the antenna elements of the second antenna module may be disposed to face the antenna elements of the first antenna module, respectively.

According to an embodiment, the distance between the first antenna module and the second antenna module may be determined based on the frequency of a radio wave radiated through the first antenna module or the second antenna module.

According to an embodiment, the controller may test the reception performance of the first antenna module by turning on each antenna element group of the second antenna module and obtaining the reception power of the first antenna module whenever the antenna element group is turned on.

According to an embodiment, the reception power of the first antenna module may be determined based on the reception power received at each antenna element of the first antenna module, and the reception power received at each antenna element may be determined based on the reception power received from the antenna element group that is turned on.

According to an embodiment, the controller may test the transmission performance of the first antenna module by controlling each antenna element group of the second antenna module to receive transmission power transmitted by each antenna element of the first antenna module.

According to an embodiment, the controller may determine the reception power received for each antenna element group through power dividers disposed corresponding to the antenna element groups of the second antenna module.

According to an embodiment, one antenna element group may include at least one sub antenna array, and one sub antenna array may include a first antenna element capable of emitting vertically and horizontally polarized waves and a second antenna element capable of emitting vertically and horizontally polarized waves.

According to an embodiment, the distance between the first antenna module and the second antenna module may be determined based on the number of antenna element groups constituting the second antenna module.

According to an embodiment, the time required for the performance test of the first antenna module may be determined based on the number of antenna elements constituting each antenna element group.

According to an embodiment, a test method for an antenna module including a plurality of antenna elements may include: disposing a first antenna module and disposing a second antenna module to face the first antenna module so as to radiate radio waves toward the first antenna module; grouping antenna elements of the second antenna module into at least one element group; and testing the performance of the first antenna module by controlling each antenna element group of the second antenna module.

According to an embodiment, the number of antenna elements of the first antenna module and the number of antenna elements of the second antenna module may be the same, and, in disposing a first antenna module and a second antenna module, the second antenna module may be disposed so that antenna elements of the second antenna module face antenna elements of the first antenna module, respectively.

According to an embodiment, the distance between the first antenna module and the second antenna module may be determined based on the frequency of a radio wave radiated through the first antenna module or the second antenna module.

According to an embodiment, testing the performance of the first antenna module may include: turning on each antenna element group of the second antenna module; obtaining the reception power of the first antenna module whenever the antenna element group is turned on; and testing the reception performance of the first antenna module based on the obtained reception power of the first antenna module.

According to an embodiment, obtaining the reception power of the first antenna module may include determining reception power received from each antenna element group of the second antenna module turned on through each antenna element of the first antenna module.

According to an embodiment, testing the performance of the first antenna module may include: receiving, by each antenna element group of the second antenna module, transmission power transmitted by each antenna element of the first antenna module; and testing the transmission performance of the first antenna module based on the reception power received by each antenna element group.

According to an embodiment, determining the reception power received for each antenna element group through power dividers disposed corresponding to the antenna element groups of the second antenna module may be further included.

According to an embodiment, one antenna element group may include at least one sub antenna array, and one sub antenna array may include a first antenna element capable of emitting vertically and horizontally polarized waves and a second antenna element capable of emitting vertically and horizontally polarized waves.

According to an embodiment, the distance between the first antenna module and the second antenna module may be determined based on the number of antenna element groups constituting the second antenna module.

According to an embodiment, the time required for the performance test of the first antenna module may be determined based on the number of antenna elements constituting each antenna element group.

The embodiments of the disclosure disclosed in the present specification and drawings are only provided as specific examples to easily explain the technical details of the disclosure and to aid understanding of the disclosure, and are not intended to limit the scope of the disclosure. That is, it will be apparent to those of ordinary skill in the art that other modifications based on the technical idea of the disclosure can be carried out. In addition, some of the embodiments may be combined with each other if necessary for operation. For example, some of the methods proposed in the disclosure may be combined with each other and applied to a base station and a terminal.

The invention claimed is:

1. An antenna module test device for testing performance of an antenna module, comprising:
a seating portion on which a first antenna module including a plurality of antenna elements is seated;
a second antenna module that includes a plurality of antenna elements and is disposed to face the seating portion so as to radiate radio waves toward the first antenna module; and
a controller that is electrically connected to the second antenna module and is configured to test performance of the first antenna module by controlling the second antenna module through grouping antenna elements of the second antenna module into at least one antenna element group.

2. The antenna module test device of claim 1,
wherein a number of antenna elements of the first antenna module and a number of antenna elements of the second antenna module are the same, and
wherein antenna elements of the second antenna module are disposed to face antenna elements of the first antenna module, respectively.

3. The antenna module test device of claim 1, wherein a distance between the first antenna module and the second antenna module is determined based on a frequency of a radio wave radiated through the first antenna module or the second antenna module.

4. The antenna module test device of claim 1, wherein the controller is configured to test reception performance of the first antenna module by turning on each antenna element group of the second antenna module and obtaining reception power of the first antenna module whenever the antenna element group is turned on.

5. The antenna module test device of claim 4,
wherein the reception power of the first antenna module is determined based on reception power received at each antenna element of the first antenna module, and
wherein the reception power received at each antenna element is determined based on reception power received from the antenna element group that is turned on.

6. The antenna module test device of claim 1, wherein the controller is configured to test transmission performance of the first antenna module by controlling each antenna element group of the second antenna module to receive transmission power transmitted by each antenna element of the first antenna module.

7. The antenna module test device of claim 1,
wherein one antenna element group includes at least one sub antenna array, and
wherein one sub antenna array includes:
a first antenna element capable of emitting vertically and horizontally polarized waves, and
a second antenna element capable of emitting vertically and horizontally polarized waves.

8. The antenna module test device of claim 1, wherein a distance between the first antenna module and the second antenna module is determined based on a number of antenna element groups constituting the second antenna module.

9. A test method for an antenna module including a plurality of antenna elements, the test method comprising:
disposing a first antenna module and disposing a second antenna module to face the first antenna module so as to radiate radio waves toward the first antenna module;
grouping antenna elements of the second antenna module into at least one element group; and
testing performance of the first antenna module by controlling each antenna element group of the second antenna module.

10. The test method of claim 9,
wherein a number of antenna elements of the first antenna module and a number of antenna elements of the second antenna module are the same, and
wherein in disposing a first antenna module and a second antenna module, the second antenna module is disposed in a manner that antenna elements of the second antenna module face antenna elements of the first antenna module, respectively.

11. The test method of claim 9, wherein a distance between the first antenna module and the second antenna module is determined based on a frequency of a radio wave radiated through the first antenna module or the second antenna module.

12. The test method of claim 9, wherein testing performance of the first antenna module comprises:
turning on each antenna element group of the second antenna module;
obtaining reception power of the first antenna module whenever the antenna element group is turned on; and
testing reception performance of the first antenna module based on the obtained reception power of the first antenna module.

13. The test method of claim 12, wherein obtaining reception power of the first antenna module comprises determining reception power received from each antenna element group of the second antenna module turned on through each antenna element of the first antenna module.

14. The test method of claim 9, wherein testing performance of the first antenna module comprises:
receiving, by each antenna element group of the second antenna module, transmission power transmitted by each antenna element of the first antenna module; and
testing transmission performance of the first antenna module based on reception power received by each antenna element group.

15. The test method of claim 9,
wherein one antenna element group includes at least one sub antenna array; and
wherein one sub antenna array includes:
a first antenna element capable of emitting vertically and horizontally polarized waves, and
a second antenna element capable of emitting vertically and horizontally polarized waves.

16. The antenna module test device of claim 1, wherein the controller is configured to determine reception power received for each antenna element group through power dividers disposed corresponding to the antenna element groups of the second antenna module.

17. The antenna module test device of claim 1, wherein a time required for the performance test of the first antenna module is determined based on a number of antenna elements constituting each antenna element group.

18. The test method of claim 14, the method further comprising:
determining the reception power received for each antenna element group through power dividers disposed corresponding to the antenna element groups of the second antenna module.

19. The test method of claim 11, wherein the distance between the first antenna module and the second antenna module is determined based on a number of antenna element groups constituting the second antenna module.

20. The test method of claim 9, wherein a time required for the performance test of the first antenna module is determined based on a number of antenna elements constituting each antenna element group.

* * * * *